(12) United States Patent
Hsueh

(10) Patent No.: US 7,772,068 B2
(45) Date of Patent: Aug. 10, 2010

(54) METHOD OF MANUFACTURING NON-VOLATILE MEMORY

(75) Inventor: Ming-Hsiang Hsueh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 268 days.

(21) Appl. No.: 11/468,575

(22) Filed: Aug. 30, 2006

(65) Prior Publication Data

US 2008/0057651 A1 Mar. 6, 2008

(51) Int. Cl.
*H01L 21/8247* (2006.01)
(52) U.S. Cl. .............................. 438/265; 257/E21.681
(58) Field of Classification Search .............. 438/142, 438/211, 510, 584, 689, 758, 257, 258, 265, 438/267; 365/185.06, 185.17; 257/314, 257/315, 316, 324, 326, E21.681, E21.682
See application file for complete search history.

(56) References Cited

U.S. PATENT DOCUMENTS

| | | | |
|---|---|---|---|
| 5,286,994 A | 2/1994 | Ozawa et al. | |
| 5,319,229 A | 6/1994 | Shimoji et al. | |
| 5,654,917 A * | 8/1997 | Ogura et al. | 365/185.18 |
| 5,817,572 A * | 10/1998 | Chiang et al. | 438/624 |
| 5,952,692 A | 9/1999 | Nakazato et al. | |
| 6,011,725 A | 1/2000 | Eitan et al. | |
| 6,026,026 A | 2/2000 | Chan et al. | |
| 6,074,917 A | 6/2000 | Chang et al. | |
| 6,166,958 A * | 12/2000 | Naruke et al. | 365/185.24 |
| 6,169,693 B1 | 1/2001 | Chan et al. | |
| 6,218,700 B1 | 4/2001 | Papadas et al. | |
| 6,512,696 B1 | 1/2003 | Fan et al. | |
| 6,563,728 B2 * | 5/2003 | Kobayashi | 365/63 |
| 6,709,928 B1 | 3/2004 | Jenne et al. | |
| 6,720,630 B2 | 4/2004 | Mandelman et al. | |
| 6,784,480 B2 | 8/2004 | Bhattacharyya | |

(Continued)

FOREIGN PATENT DOCUMENTS

| | | |
|---|---|---|
| EP | 0016246 | 10/1980 |
| EP | 1411555 | 4/2004 |
| JP | 2004363329 | 12/2004 |

OTHER PUBLICATIONS

White et al., "On the Go with SONOS" IEEE Circuits and Devices, Jul. 2000, 22-31.

(Continued)

*Primary Examiner*—Matthew C Landau
*Assistant Examiner*—Daren Wolverton
(74) *Attorney, Agent, or Firm*—Haynes Beffel & Wolfeld LLP

(57) ABSTRACT

A method of manufacturing a non-volatile memory including the following steps is provided. First, a dielectric layer, a first conductive layer and a patterned mask layer are sequentially formed on a substrate. A portion of the first conductive layer is removed using the patterned mask layer as a mask to form a plurality of first gates. An oxidation process is performed to form an oxide layer on the sidewalls of the first gates. The patterned mask layer is removed. A plurality of second gates is formed between two adjacent first gates so that the first gates and the second gates co-exist to form a memory cell column. A doped region is formed in the substrate adjacent to the memory cell column.

13 Claims, 4 Drawing Sheets

U.S. PATENT DOCUMENTS

| | | | |
|---|---|---|---|
| 6,818,558 | B1 | 11/2004 | Rathor et al. |
| 6,897,533 | B1 | 5/2005 | Yang et al. |
| 6,912,163 | B2 | 6/2005 | Zheng et al. |
| 7,071,061 | B1* | 7/2006 | Pittikoun .................... 438/267 |
| 7,075,828 | B2 | 7/2006 | Lue et al. |
| 7,115,469 | B1 | 10/2006 | Halliyal et al. |
| 7,115,942 | B2 | 10/2006 | Wang |
| 7,120,059 | B2 | 10/2006 | Yeh et al. |
| 7,133,313 | B2 | 11/2006 | Shih et al. |
| 7,151,692 | B2 | 12/2006 | Wu et al. |
| 7,164,603 | B2 | 1/2007 | Shih et al. |
| 7,190,614 | B2 | 3/2007 | Wu et al. |
| 7,209,390 | B2 | 4/2007 | Lue et al. |
| 7,387,932 | B2 | 6/2008 | Yeh et al. |
| 2001/0046727 | A1* | 11/2001 | Lin et al. .................... 438/142 |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183126 | A1 | 9/2004 | Bae et al. |
| 2005/0006696 | A1 | 1/2005 | Noguchi et al. |
| 2005/0023603 | A1 | 2/2005 | Eldridge et al. |
| 2005/0074937 | A1 | 4/2005 | Jung |
| 2005/0093054 | A1 | 5/2005 | Jung |
| 2005/0170579 | A1* | 8/2005 | Hsu et al. .................... 438/211 |
| 2005/0218522 | A1 | 10/2005 | Nomoto et al. |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0017085 | A1* | 1/2006 | Tuntasood et al. .......... 257/296 |
| 2006/0019445 | A1 | 1/2006 | Chen |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2006/0286749 | A1* | 12/2006 | Tseng et al. ................ 438/261 |
| 2007/0012988 | A1 | 1/2007 | Bhattacharyya |
| 2007/0029625 | A1 | 2/2007 | Lue et al. |
| 2007/0031999 | A1* | 2/2007 | Ho et al. .................... 438/142 |
| 2007/0045718 | A1 | 3/2007 | Bhattacharyya |
| 2007/0069283 | A1 | 3/2007 | Shih et al. |
| 2007/0267687 | A1 | 11/2007 | Lue |

OTHER PUBLICATIONS

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "PHINES: A Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Baik, Seung, et al., "High Speed and Nonvolatile Si Nanocrystal Memory for Scaled Flash Technology using Highly Field-Sensitive Tunnel Barrier," IEEE IEDM 03-545, 22.3.1-22.3.4.

Lee, Chang, et al., "A Novel SONOS Structure of SiO2/SiN/Al2O3 with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Resarch Conf., 2002, Conf. Digest 153-154.

Blomme, et al., Write/Erase Cycling Endurance of Memory Cells with SiO2/HfO2 Tunnel Dielectric, IEEE Trans on Device and Materials Reliability, vol. 4, No. 3, Sep. 2004, 345-351.

Govoreanu, et al, "VARIOT: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Lue et al., "BE-SONOS: A Bandgap Engineered SONOS with Excellent Performance and Reliability," IEDM Tech Digest, IEEE Int'l Dec. 2005, 547-550.

Sune, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

* cited by examiner

METHOD OF MANUFACTURING NON-VOLATILE MEMORY

BACKGROUND OF THE INVENTION

1. Field of the Invention

The present invention relates to a semiconductor device, and more particularly, to a method of manufacturing a non-volatile memory.

2. Description of Related Art

As the name implies, memory is a semiconductor device designed specially for storing data or codes. As the functions provided by a computer microprocessor are increasingly powerful and the amount of programming and computation in most computer software continues to increase, memory with larger storage capacity is urgently needed. In order to fabricate cheaper and larger capacity memory, the techniques and processes of fabricating memory devices is the driving force behind the challenge of pushing semiconductor technologies toward a higher level of integration.

Non-volatile memory is a type of memory device that allows multiple data writing, reading and erasing operations. Furthermore, the stored data will be retained even after power to the device is removed. With these advantages, non-volatile memory has been broadly applied in personal computer and electronic equipment.

At present, one of the more commonly used memory array structures includes the NAND type array structure. Because the NAND type array structure mainly contains a serially connected memory cells whose programming and erasing operations are carried out together, a memory cell array fabricated as a NAND type array structure is able to increase the packing density of devices and ultimately their level of integration.

With the rapid development of fabrication processes and the continuous reduction of device dimensions, the space between the NAND type array structure and various memory cells is being shrink correspondingly. However, due to the limitation of the process window in photolithographic and etching processes, it is very difficult to fabricate a product that meets the required memory cell size and spatial separation between memory cells. Furthermore, in a subsequent process, the slight shrinkage of size that leads to a relative shrinkage of the space between the memory cells can lead to additional problems. For example, when filling the space between various memory cells with an insulating material, the insulating material layer inside the space may form voids or the insulating material may be prevented from filling up the space. Consequently, the reliability of the process is questionable.

SUMMARY OF THE INVENTION

Accordingly, at least one objective of the present invention is to provide a method of manufacturing a non-volatile memory capable for avoiding voids or missing the space altogether during the process of filling the space between memory cells using an insulating material and thereby increase the level of device integration.

To achieve these and other advantages and in accordance with the purpose of the invention, as embodied and broadly described herein, the invention provides a method of manufacturing a non-volatile memory including the following steps. First, a dielectric layer, a first conductive layer and a patterned mask layer are sequentially formed on a substrate. Next, a portion of the first conductive layer is removed using the patterned mask layer as a mask to form a plurality of first gates. An oxidation process is performed to form an oxide layer on the sidewalls of the first gates. Thereafter, the patterned mask layer is removed. A plurality of second gates is formed between two adjacent first gates so that the first gates and the second gates co-exist to form a memory cell column. After that, a doped region is formed in the substrate adjacent to the memory cell column.

According to the method of manufacturing non-volatile memory in one embodiment of the present invention, the foregoing oxidation process is, for example, an in situ steam generation (ISSG) oxidation process or a thermal oxidation process.

According to the method of manufacturing non-volatile memory in one embodiment of the present invention, the material constituting the foregoing oxide layer includes silicon dioxide, for example.

According to the method of manufacturing non-volatile memory in one embodiment of the present invention, the method of forming the second gates includes, for example, forming a second conductive layer over the substrate to cover the first gates, the oxide layer and the dielectric layer. Next, a portion of the second conductive layer is removed to expose the surface of the first gates.

According to the method of manufacturing non-volatile memory in one embodiment of the present invention, the method of removing a portion of the second conductive layer to expose the surface of the first gates includes, for example, performing a chemical-mechanical polishing or a back etching process.

According to the method of manufacturing non-volatile memory in one embodiment of the present invention, the first and the second gates are fabricated using an identical material such as doped polysilicon.

According to the method of manufacturing non-volatile memory in one embodiment of the present invention, the foregoing dielectric layer is, for example, a silicon oxide layer or a composite dielectric layer. The composite dielectric layer is an oxide-nitride-oxide (ONO) layer or an oxide-nitride-oxide-nitride-oxide (ONONO) layer, for example.

According to the method of manufacturing non-volatile memory in one embodiment of the present invention, the material constituting the foregoing patterned mask layer includes silicon nitride, for example.

According to the method of manufacturing non-volatile memory in one embodiment of the present invention, the method of forming the foregoing doped region includes, for example, the following steps. First, a photoresist layer is formed over the memory cell column. Next, an ion implantation is performed using the photoresist layer as a mask. Finally, the photoresist layer is removed.

According to the method of manufacturing non-volatile memory in one embodiment of the present invention, the method of removing the foregoing patterned mask layer includes, for example, performing an etching process or a lift-off process.

The present invention also provides an alternative method of manufacturing a non-volatile memory including the following steps. First, a dielectric layer, a first conductive layer and a patterned mask layer are sequentially formed on a substrate. Next, a portion of the first conductive layer is removed using the patterned mask layer as a mask to form a plurality of first gates. An oxidation process is performed to form an oxide layer on the sidewalls of the first gates. Thereafter, a second conductive layer is formed above the substrate. A portion of the second conductive layer is removed to expose the surface of the oxide layer. Next, the patterned mask layer is removed to form a plurality of second gates between two adjacent first gates so that the first gates and the second gates co-exist to form a memory cell column. Next, a doped region is formed in the substrate adjacent to the memory cell column.

According to the method of manufacturing non-volatile memory in one embodiment of the present invention, the foregoing oxidation process is, for example, an in situ steam generation (ISSG) oxidation process or a thermal oxidation process.

According to the method of manufacturing non-volatile memory in one embodiment of the present invention, the material constituting the foregoing oxide layer includes silicon dioxide, for example.

According to the method of manufacturing non-volatile memory in one embodiment of the present invention, the method of removing a portion of the second conductive layer to expose the surface of the oxide layer includes, for example, performing a etching back process.

According to the method of manufacturing non-volatile memory in one embodiment of the present invention, the first and the second gates are fabricated using an identical material such as doped polysilicon.

According to the method of manufacturing non-volatile memory in one embodiment of the present invention, the foregoing dielectric layer is, for example, a silicon oxide layer or a composite dielectric layer. The composite dielectric layer is an oxide-nitride-oxide (ONO) layer or an oxide-nitride-oxide-nitride-oxide (ONONO) layer, for example.

According to the method of manufacturing non-volatile memory in one embodiment of the present invention, the material constituting the foregoing patterned mask layer includes silicon nitride, for example.

According to the method of manufacturing non-volatile memory in one embodiment of the present invention, the method of forming the foregoing doped region includes, for example, the following steps. First, a photoresist layer is formed over the memory cell column. Next, an ion implantation is performed using the photoresist layer as a mask. Finally, the photoresist layer is removed.

According to the method of manufacturing non-volatile memory in one embodiment of the present invention, the method of removing the foregoing patterned mask layer includes, for example, performing an etching process or a lift-off process.

In the present invention, an oxide layer is formed on the sidewalls of the first gates to serve as a dielectric material layer that fills the space between the memory cells of a conventional memory cell column before forming the second gates and completing the memory cell column. Therefore, the possibility of formation of voids in the insulation material layer or some missing space the insulation material may be effectively reduced. Furthermore, the oxide layer is formed in an oxidation process in the present invention. Hence, by adjusting the processing condition of the oxidation process, thickness of the oxide layer can be controlled so that the smallest possible spatial separation between adjacent memory cells in a memory cell column constrained by the photolithographic and etching process can be relaxed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
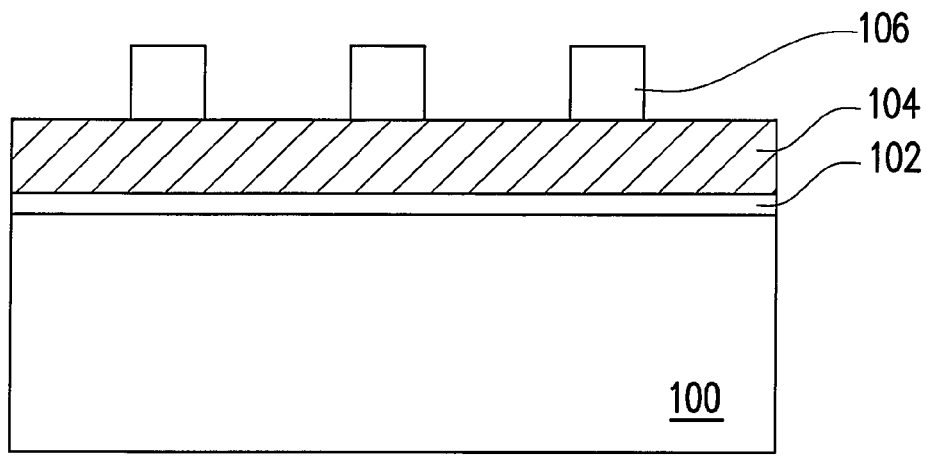
FIGS. 1A through 1F are schematic cross-sectional views showing the steps for fabricating a non-volatile memory according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the steps for fabricating a non-volatile memory according to one embodiment of the present invention.

First, as shown in FIG. 1A, a substrate 100 is provided. The substrate 100 is, for example, a silicon substrate or other semiconductor substrate. Next, a dielectric layer 102 is formed on the substrate 100. The dielectric layer 102 is, for example, a silicon oxide layer formed by performing a chemical vapor deposition process. Obviously, the dielectric layer 102 can be, for example, a composite dielectric layer comprising a multiple of layers. The composite dielectric layer can be an oxide-nitride-oxide (ONO) layer or an oxide-nitride-oxide-nitride-oxide (ONONO) layer, for example.

After forming the dielectric layer 102, a conductive layer 104 is formed on the dielectric layer 102. The conductive layer 104 is, for example, a doped polysilicon formed by performing a chemical vapor deposition process. Next, a patterned mask layer 106 is formed on the conductive layer 104. The patterned mask layer 106 is, for example, a silicon nitride layer formed by performing a chemical vapor deposition process.

Figure 1B:
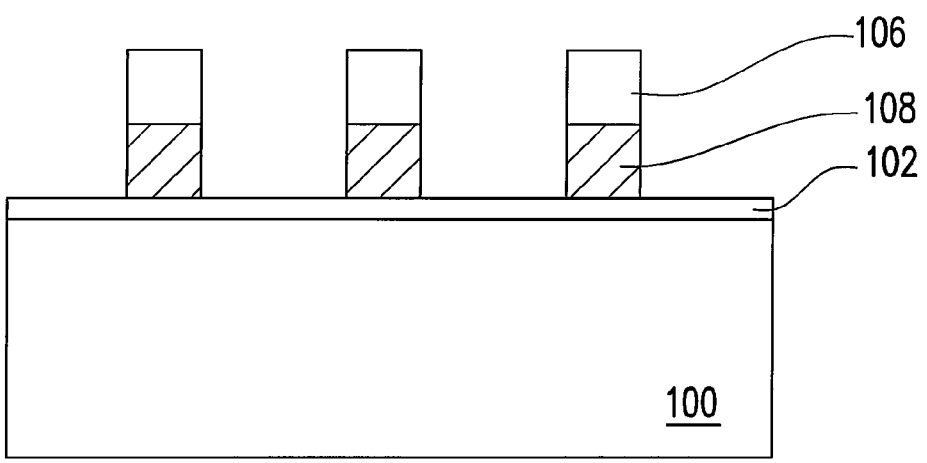

Next, as shown in FIG. 1B, a portion of the conductive layer 104 is removed using the patterned mask layer 106 as a mask to form a plurality of gates 108. The method of removing a portion of the conductive layer 104 includes, for example, performing an etching process.

Figure 1C:
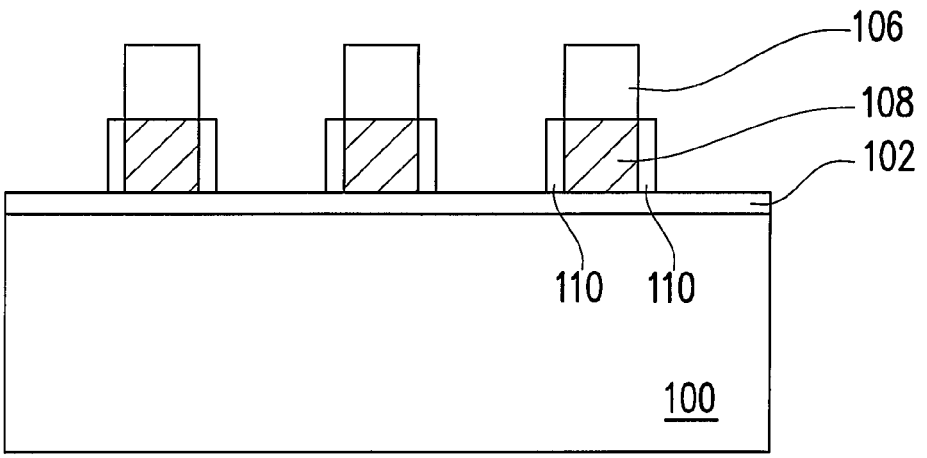

As shown in FIG. 1C, an oxidation process is performed to form an oxide layer 110 on the sidewalls of the gates 108. The foregoing oxidation process can be, for example, an in situ steam generation (ISSG) oxidation process or a thermal oxidation process. The material constituting the oxide layer 110 is silicon dioxide, for example.

It should be noted that the oxide layer 110 formed on the sidewalls of the gates 108 serves as an insulating material layer that fills the space between the memory cells of a conventional memory cell column before forming the second gates and completing the memory cell column. Furthermore, the oxide layer 110 is formed in an oxidation process in the present invention. Hence, by adjusting the processing condition of the oxidation process, thickness of the oxide layer 110 can be controlled so that the smallest possible spatial separation between adjacent memory cells in a memory cell column constrained by the photolithographic and etching process can be relaxed.

In addition, the early formation of the oxide layer 110 on the sidewalls of the gates 108, compared with the conventional process, prevents the insulating material layer that fills the space between neighboring memory cells with voids or some missing space in insulating material layer. Thus, the reliability of the entire process may be effectively improved.

Figure 1D:
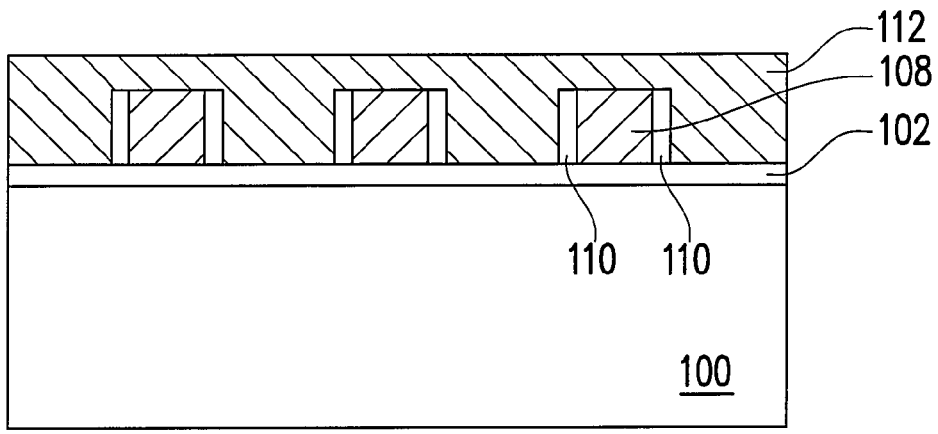

As shown in FIG. 1D, the patterned mask layer 106 above the gates 108 is removed after forming the oxide layer 110. The method of removing the mask layer 106 includes, for example, performing an etching process or a lift-off process. After that, a conductive layer 112 is formed over the substrate 100 to cover the gates 108, the oxide layer 110 and the dielectric layer 102. The conductive layer 112 is, for example, a doped polysilicon formed by performing a chemical vapor deposition process.

Figure 1E:
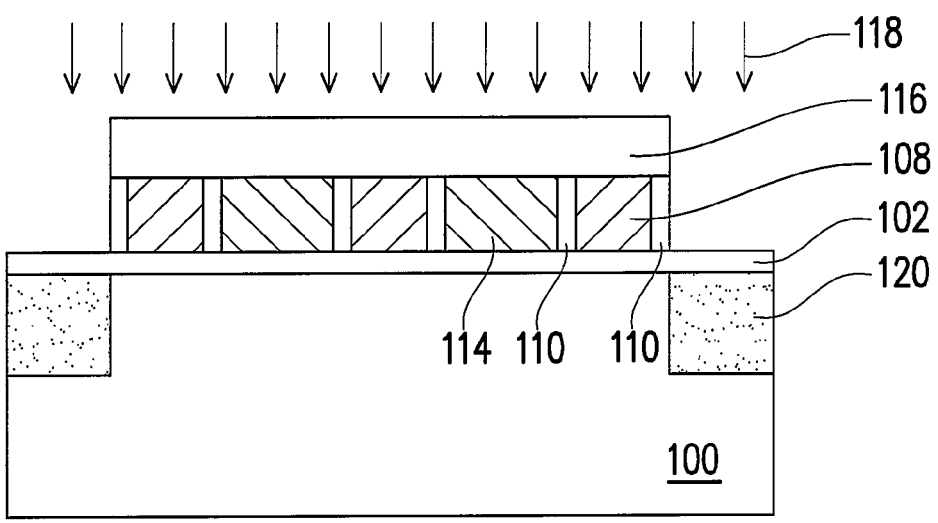

As shown in FIG. 1E, a portion of the conductive layer 112 is removed to expose the surface of the gates 108 so that a plurality of gates 114 is formed between two adjacent gates 108. The method of removing a portion of the conductive layer 112 to expose the surface of the gates 108 includes, for example, performing a chemical-mechanical polishing process or an etching back process.

The gates 114 and the gates 108 co-exist to form a memory cell column. Next, a photoresist layer 116 is formed over the memory cell column. Thereafter, an ion implant process 118 is performed using the photoresist layer 116 as a mask to form a doped region 120 in the substrate 100 on the sides of the memory cell column.

Figure 1F:
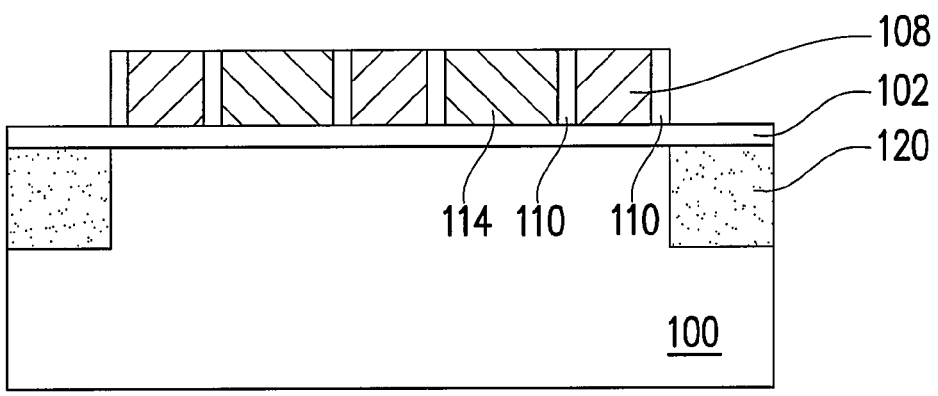

As shown in FIG. 1F, the photoresist layer 116 is removed after forming the doped regions 120. Thus, the fabrication of a non-volatile memory in the present embodiment is complete.

Figure 2A:
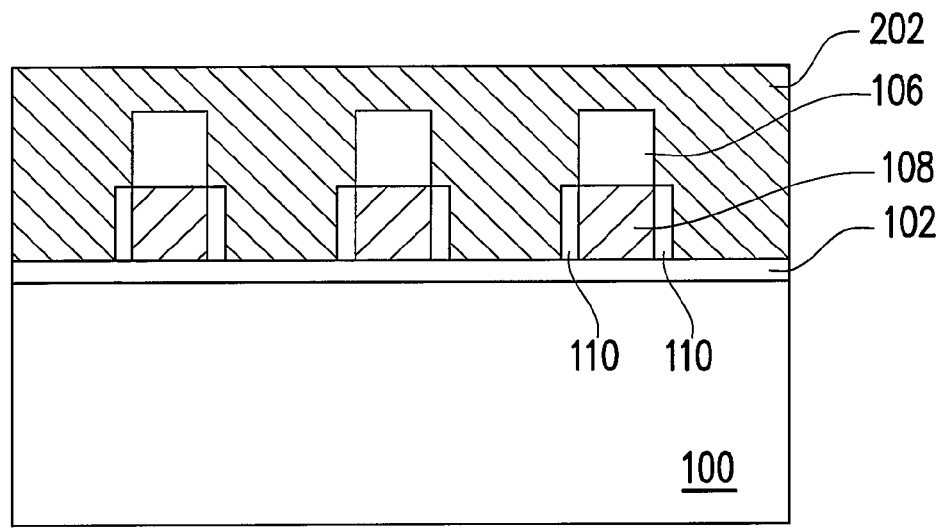
FIGS. 2A through 2D are schematic cross-sectional views showing the steps for fabricating a non-volatile memory according to another embodiment of the present invention.

Aside from the foregoing embodiment, the present invention also provides another embodiment for fabricating the non-volatile memory. FIGS. 2A through 2D are schematic cross-sectional views showing the steps for fabricating a non-volatile memory according to another embodiment of the present invention. FIG. 2A is a continuation of the steps in FIG. 1C carried out in the foregoing embodiment. Moreover, the elements in FIGS. 1A through 1F identical to the ones in FIGS. 2A through 2D are labeled identically.

First, as shown in FIG. 2A, the main difference from the previous embodiment shown in FIGS. 1A through 1F is that the patterned mask layer 106 is not removed after forming the oxide layer 110 in the present embodiment. Instead, a conductive layer 202 is directly formed over the substrate 100. The conductive layer 202 is, for example, a doped polysilicon layer formed by performing a chemical vapor deposition process.

Figure 2B:
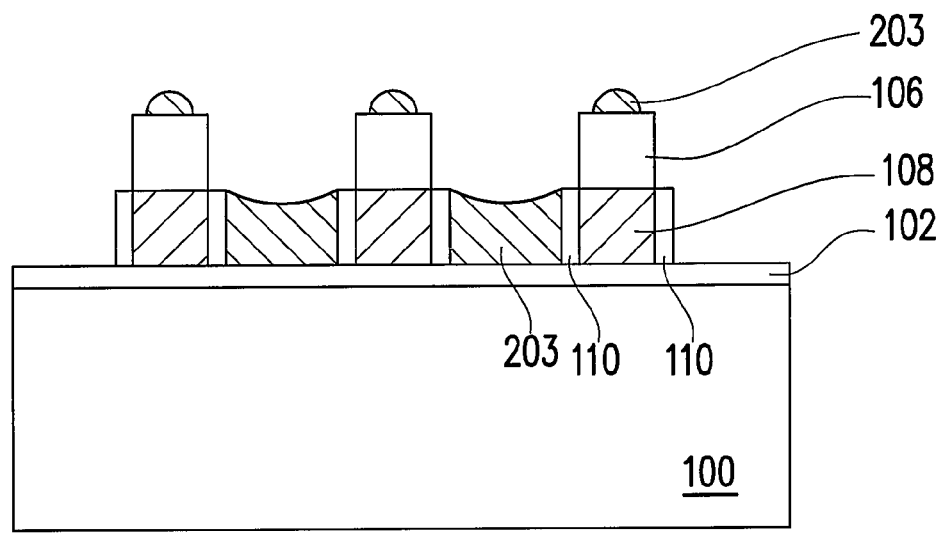

Next, as shown in FIG. 2B, after forming the conductive layer 202, a portion of the conductive layer 202 is removed to expose the surface of the oxide layer 110 and form a conductive layer 203. The method of removing a portion of the conductive layer 202 includes, for example, performing an etching back process. A portion of the residual conductive layer 203 remains on the upper surface of the patterned mask layer 106.

Figure 2C:
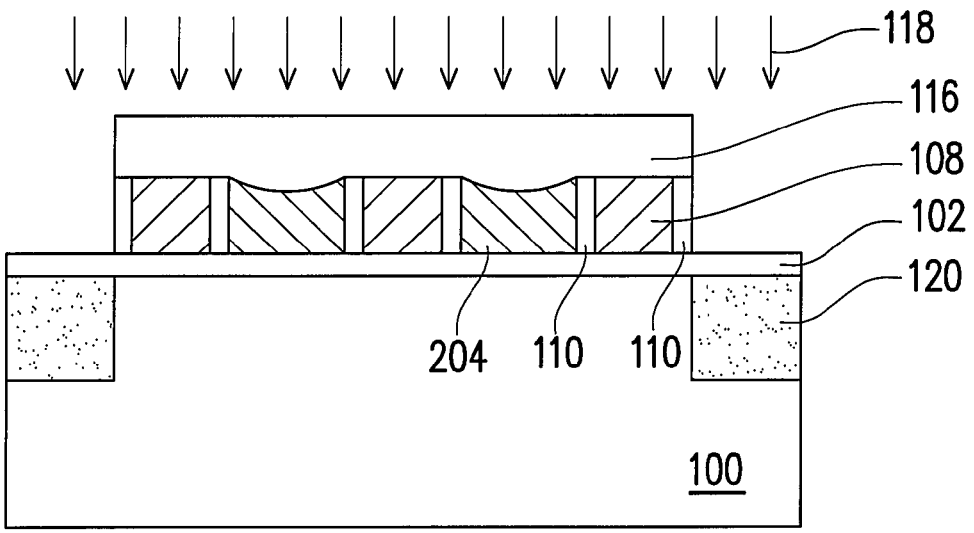

Next, as shown in FIG. 2C, the patterned mask layer 106 is removed. The method of removing the patterned mask layer 106 includes, for example, performing an etching process or a lift-off process. After removing the patterned mask layer 106, the residual conductive layer 203 on the upper surface of the patterned mask layer 106 is also removed, thereby forming a plurality of gates 204 between two adjacent gates 108.

The gates 204 and the gates 108 co-exist to form a memory cell column. Next, a photoresist layer 116 is formed over the memory cell column. Thereafter, an ion implant process 118 is performed using the photoresist layer 116 as a mask to form a doped region 120 in the substrate 100 on the sides of the memory cell column.

Figure 2D:
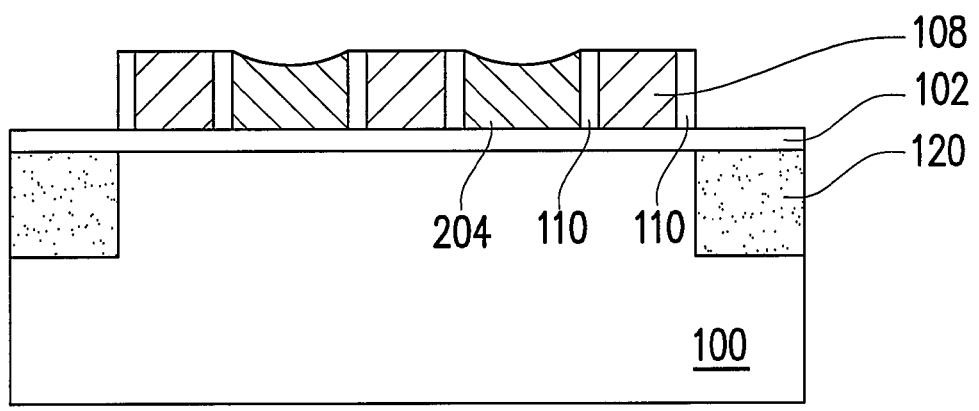

As shown in FIG. 2D, the photoresist layer 116 is removed after forming the doped regions 120. Thus, the fabrication of a non-volatile memory in the present embodiment is complete.

In summary, the method in the present invention has at least the following advantages.

1. The present invention can avoid the problem of having voids in the insulating material layer filling the space between neighboring memory cells of a conventional memory cell column or missing some insulating material in some of the space between neighboring memory cells, which can significantly affect process reliability.

2. The present invention can provide a breakthrough in the minimum distance of separation between neighboring memory cells in a memory cell column due to the processing restrictions of a photolithographic and etching process.

3. The applications of the present invention are not limited to the fabrication of a non-volatile memory. It can be applied to any process requiring a reduction of device separation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory, comprising:
   sequentially forming a dielectric charge trapping layer, a first conductive layer and a patterned mask layer on a substrate;
   removing a portion of the first conductive layer using the patterned mask layer as a mask to expose portions of the dielectric charge trapping layer and form a first plurality of gates having sidewalls and top surfaces, the exposed portions extending between adjacent gates in the first plurality of gates;
   performing an oxidation process to form an oxide layer on the sidewalls of the gates in the first plurality of gates while protecting the top surfaces of the gates in the first plurality of gates from the oxidation process;
   removing the patterned mask layer after performing the oxidation process;
   forming a second plurality of gates, after removing the patterned mask layer, on the exposed portions of the dielectric charge trapping layer, the gates in the second plurality of gates interleaved with the gates in the first plurality of gates to define a plurality of respective memory cells in a NAND string, wherein the plurality of memory cells include data storage sites in the dielectric charge trapping layer beneath each gate in the first and second pluralities of gates; and
   forming a doped region in the substrate adjacent to the NAND string.

2. The method of claim 1, wherein the oxidation process comprises an in situ steam generation (ISSG) oxidation process or a thermal oxidation process.

3. The method of claim 1, wherein the oxide layer comprises silicon dioxide.

4. The method of claim 1, wherein the method of forming the second plurality of gates comprises:
   forming a second conductive layer over the substrate to cover the first plurality of gates, the oxide layer on the sidewalls and the exposed portions of the dielectric charge trapping layer; and removing a portion of the second conductive layer to expose the top surface of the first plurality of gates.

5. The method of claim 4, wherein the method of removing a portion of the second conductive layer to expose the top surface of the first plurality of gates comprises performing a chemical-mechanical polishing process or an etching back process.

6. The method of claim 1, wherein the material constituting the first gates and the second gates are identical and comprises doped polysilicon.

7. The method of claim 1, wherein the dielectric layer comprises a composite dielectric layer.

8. The method of claim 1, wherein the dielectric layer comprises an oxide-nitride-oxide (ONO) layer or an oxide-nitride-oxide-nitride-oxide (ONONO) layer.

9. The method of claim 1, wherein the patterned mask layer comprises silicon nitride.

10. The method of claim 1, wherein the method of forming the doped region comprises:
    forming a photoresist layer on the memory cell column;
    performing an ion implant process using the photoresist layer as a mask; and
    removing the photoresist layer.

11. The method of claim 1, wherein the method of removing the patterned mask layer comprises performing an etching process or a lift-off process.

12. The method of claim 1, wherein:
    the substrate has one of an n-type or p-type conductivity; and
    the memory cells in the plurality of memory cells include respective channel regions in the substrate beneath corresponding gates in the pluralities of gates, without intervening terminals between the channel regions of adjacent memory cells having a different conductivity type.

13. A method of fabricating a non-volatile memory, comprising:
    forming a dielectric charge trapping layer and a first conductive layer over a substrate;
    forming a mask layer over the first conductive layer;
    removing a portion of the first conductive layer using the mask layer to expose portions of the dielectric charge trapping layer and form a first plurality of gates having sidewalls and top surfaces, the exposed portions of the dielectric charge trapping layer extending between adjacent first gates;
    applying a process to form an insulating layer on the sidewalls of the first plurality of gates while protecting the top surfaces of the first plurality of gates from the process;
    removing the mask layer after applying the process;
    forming a second conductive layer, after removing the mask layer, to cover the first plurality of gates, the insulating layer and the dielectric charge trapping layer; and
    removing a portion of the second conductive layer to expose the top surface of the first gates to form a plurality of second gates, the gates in the second plurality of gates interleaved with the gates in the first plurality of gates to define a plurality of memory cells in a NAND string, wherein the plurality of memory cells include data storage sites in the dielectric charge trapping layer beneath each gate in the first and second pluralities of gates.

* * * * *